(12) United States Patent
Mizuguchi et al.

(10) Patent No.: US 7,675,053 B2
(45) Date of Patent: Mar. 9, 2010

(54) MEMORY DEVICE COMPRISING A MEMORY LAYER AND A METAL CHALCOGENIDE ION-SOURCE LAYER

(75) Inventors: Tetsuya Mizuguchi, Kanagawa (JP); Katsuhisa Aratani, Chiba (JP); Akihiro Maesaka, Kanagawa (JP); Akira Kouchiyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 282 days.

(21) Appl. No.: 11/328,049

(22) Filed: Jan. 9, 2006

(65) Prior Publication Data
US 2006/0189084 A1 Aug. 24, 2006

(30) Foreign Application Priority Data
Jan. 11, 2005 (JP) ............... P2005-004178

(51) Int. Cl.
*H01L 45/00* (2006.01)
(52) U.S. Cl. .................. 257/3; 257/E45.002
(58) Field of Classification Search .......... 257/188, 257/189, 441, 442, 613–616, E31.029, E31.03, 257/1–5, E45.001–E45.004
See application file for complete search history.

(56) References Cited

U.S. PATENT DOCUMENTS

| | | | |
|---|---|---|---|
| 4,719,594 A * | 1/1988 | Young et al. ............... 365/113 |
| 5,846,625 A * | 12/1998 | Terao et al. ............... 428/64.1 |
| 6,087,674 A | 7/2000 | Ovshinsky et al. |
| 6,788,864 B2 * | 9/2004 | Ahmad et al. ............... 385/123 |
| 6,977,835 B2 | 12/2005 | Kang |
| 7,129,133 B1 | 10/2006 | Avanzino et al. |
| 2003/0048519 A1 * | 3/2003 | Kozicki ............... 359/252 |
| 2003/0234449 A1 | 12/2003 | Aratani et al. |

FOREIGN PATENT DOCUMENTS

WO    WO 2004084306 A1 * 9/2004

OTHER PUBLICATIONS

Phys. Rev. Lett. 21, (1968) p. 1450 by S.R. Ovshinsky is cited as an example of a phase change memory device.

* cited by examiner

*Primary Examiner*—Marcos D. Pizarro
(74) *Attorney, Agent, or Firm*—Wolf, Greenfield & Sacks, P.C.

(57) ABSTRACT

A memory element in which data recording and data readout can be performed stably without difficulties and which can be manufactured with a comparatively simplified method is provided.

The memory element 10 includes a memory layer 4 and an ion source layer 3 positioned between the first electrode 2 and the second electrode 6, in which the ion source layer 3 contains any of elements selected from Cu, Ag, Zn and any of elements selected from Te, S, Se, and the ion source layer further contains boron (or rare-earth elements and silicon).

20 Claims, 10 Drawing Sheets

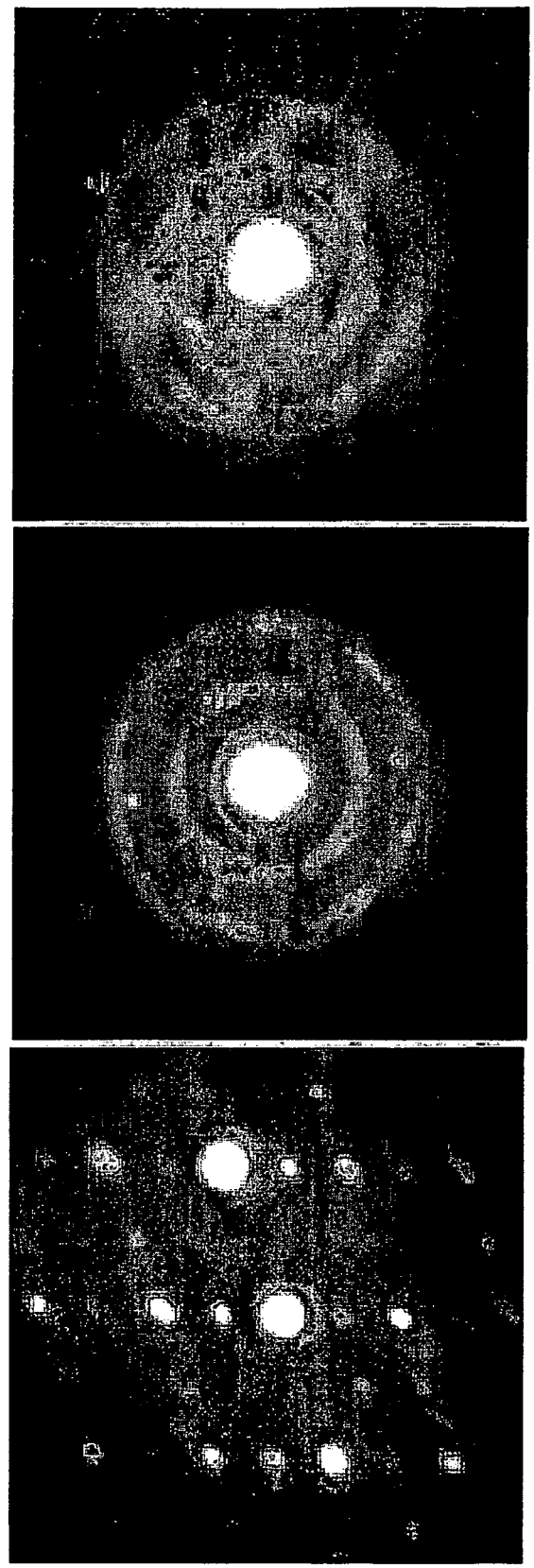

US 7,675,053 B2

MEMORY DEVICE COMPRISING A MEMORY LAYER AND A METAL CHALCOGENIDE ION-SOURCE LAYER

CROSS REFERENCES TO RELATED APPLICATIONS

The present invention contains subject matter related to Japanese Patent Application JP 2005-004178 filed in the Japanese Patent Office on Jan. 11, 2005, the entire contents of which being incorporated herein by reference.

BACKGROUND OF THE INVENTION

1. Field of the Invention

The present invention relates to a memory element in which data can be recorded and a memory device including the memory element.

2. Description of the Related Art

In information devices such as a computer, a DRAM capable of high speed operation and having high density is widely used as a random access memory.

However, since the DRAM has a complicated manufacturing process compared with a typical logic circuit LSI and signal processing employed in an electronic apparatus, manufacture costs increase.

Further, since the DRAM is a volatile memory in which data disappears when the power is shut off, such refreshing operation that data written therein is frequently read out to be again amplified and rewritten is needed.

Then, as a nonvolatile memory in which data does not disappear even if the power is shut off, FeRAM (Ferroelectric Random Access Memory), MRAM (Magnetic Random Access Memory) and the like are proposed, for example.

With such memory, written data can be retained for a long time without power supply.

Further, in case of those memories, a refreshing operation is unnecessary, because the memory is made nonvolatile, and it is assumed that the power consumption be reduced to that extent.

However, in the above-described nonvolatile memory, it becomes difficult to secure properties as a memory element due to a miniaturization of a memory element that constitutes each memory cell.

Therefore, it is difficult to miniaturize the element to the limit of a design rule and to the limit in a manufacturing process.

Hereupon, a memory element of a new type has been proposed as a memory having a suitable structure for miniaturization.

This memory element has a structure in which an ion conductor containing a certain metal is positioned between two electrodes.

Further, since the metal contained in the ion conductor is contained in one of the two electrodes, the metal contained in the electrode is diffused as an ion in the ion conductor when a voltage is applied between the two electrodes, and thereby an electric characteristic such as a resistance value or capacitance of the ion conductor changes.

A memory device can be made using this characteristic (for example, refer to Patent Reference 1 and Non-patent Reference 1) Specifically, the ion conductor is made of a solid solution of a chalcogenide and metal, further specifically, the ion conductor is made of a material in which Cu, Ag, Zn are solidly solved into AsS, GeS, and GeSe, and one of the two electrodes contains Cu, Ag, Zn (refer to the-above described Patent Reference 1).

Furthermore, various kinds of nonvolatile memories using a crystalline oxide material have also been proposed, and a memory in a device, for example, having a structure in which a Cr-doped $SrZrO_3$ crystalline material is positioned between a lower electrode made of $SrRuO_3$ or Pt and an upper electrode made of Au or Pt is proposed, where a resistance is changed reversibly when applying a voltage of a different polarity (refer to the Non-patent reference 2). However, details of the principle and so on are not clear.

[Patent Reference 1] Japanese Translation of PCT International Application No. 2002-536840

[Non-patent Reference 1] Nikkei Electronics, Jan. 20, 2003 issue (page 104)

[Non-patent Reference 2] A. Beck et al., Appl. Phys. Lett., 77, (year 2000), p. 139

SUMMARY OF THE INVENTION

However, in the above-described memory element having the structure in which Cu, Ag, Zn are contained either in the upper electrode or in the lower electrode and a Ges or GeSe amorphous chalcogenide material is positioned between the electrodes, such problems as the crystallization of a chalcogenide thin film due to temperature rise, the change in properties of materials due to the crystallization, and data originally retained in a high resistance state being made into the data in a low resistance state under the high temperature environment or after a long-time storage.

Further, in the case in which a crystalline material is used as a recording material between the upper and lower electrodes, problems tend to occur compared with the case in which an amorphous material is used, and therefore mass production at low costs has been difficult.

Further, in order to obtain a high-quality crystallinity, high temperature treatment of 700° C., for example, is needed and there may be a problem that properties of a MOS transistor formed in advance may deteriorate due to heat.

Furthermore, in order to obtain crystal growth, base materials therefor are limited and a single-crystal material is required, for example.

Further, although the reason was unclear, in the case where a crystalline material, for example, is used as the base material, a switching voltage applied when a high resistance state is switched to a low resistance state tends to disperse.

In order to solve the above-described problems, the present invention provides a memory element in which data recording and data readout can be performed stably without difficulties and which can be manufactured with a comparatively simplified method, and a memory device including the memory element.

A memory element according to an embodiment of the present invention includes a memory layer and an ion source layer positioned between a first electrode and a second electrode, in which the ion source layer contains any of elements selected from Cu, Ag, Zn and any of elements selected from Te, S, Se, and further contains boron.

According to the above-described memory element of the present invention, since the memory layer and the ion source layer are positioned between the first electrode and the second electrode and any of elements selected from Cu, Ag, Zn and any of elements selected from Te, S, Se are contained in the ion source layer, data can be recorded by means of the change in the resistance state of the memory layer.

Specifically, when a positive electric potential, for example, is applied to the ion source layer containing Cu, Ag, Zn or to the side of an electrode in contact with the ion source layer and voltage is applied to the memory element, Cu, Ag, Zn (ion source elements) contained in the ion source layer are ionized and diffused in the memory layer and are combined with electrons and deposited at a portion on the side of the other electrode, or Cu, Ag, Zn remain in the memory layer to form an impurity level in an insulation film, so that the resistance value of the memory layer is lowered to the state of low resistance to enable the data recording to be performed.

Further, when in the above state a negative electric potential is applied to the ion source layer containing Cu, Ag, Zn or to one side of the electrode in contact with the ion source layer and negative voltage is applied to the memory element, Cu, Ag, Zn having been deposited on the other side of the electrode are again ionized and return to one side of the electrode, so that the resistance value of the memory layer returns to the state of high resistance and the resistance value of the memory element becomes high to enable the data erasure to be performed.

Further, since any of elements selected from Te, S, Se (chalcogenide elements) are contained in the ion source layer, ionization of Cu, Ag, Zn is facilitated.

In addition, since boron is further contained in the ion source layer, ionization of the ion source layer is controlled and the ion source layer is made to have a uniform amorphous structure or to have a uniform microcrystal structure in which a diameter of particles are extremely small and uniform, and so the microstructure of the ion source layer can be maintained stably even if heat is applied to the memory element in a heat treatment process or the like and the film state of the ion source layer (surface state thereof, for example) can favorably be maintained. In other words, the microstructure of the ion source layer can stably be maintained in semiconductor processes, particularly with respect to high-temperature heat treatment that is needed in a wiring process.

Accordingly, when data is recorded and erased, the electric field distributed in the memory layer becomes uniform to enable the switching voltage, which is a threshold value when the memory element is made into the state of low resistance from the state of high resistance, to be less dispersed, and so the uniform value can be obtained if recording and erasure are repeatedly performed.

Specifically, the ion source layer and the memory layer can be maintained favorably after high-temperature treatment is performed, which improves thermal resistance of the memory element.

A memory element according to an embodiment of the present invention includes a memory layer and an ion source layer positioned between a first electrode and a second electrode, in which the ion source layer contains any of elements selected from Cu, Ag, Zn and any of elements selected from Te, S, Se, and further rare-earth elements and silicon.

According to the above-described memory element of the present invention, since the memory layer and ion source layer are positioned between the first electrode and the second electrode and any of elements selected from Cu, Ag, Zn and any of elements selected from Te, S, Se are contained in the ion source layer, data can be recorded by means of the change in the resistance state of the memory layer.

Further, since any of the elements selected from Te, S, Se (chalcogenide elements) are contained in the ion source layer, ionization of Cu, Ag, Zn is facilitated.

Furthermore, since the ion source layer further contains rare-earth elements and silicon, the ionization of the ion source layer caused by application of heat can be controlled and the ion source layer and the memory layer can be maintained favorably similarly to the structure in which the ion source layer contains boron, and so the thermal resistance of the memory element can be improved.

A memory device according to an embodiment of the present invention includes: a memory element having a memory layer and an ion source layer positioned between the first and second electrodes, in which the ion source layer contains any of elements selected from Cu, Ag, Zn, and any of elements selected from Te, S, Se and the ion source layer further contains boron; wiring connected to the first electrode side; and wiring connected to the second electrode side, wherein a number of the memory elements are disposed.

According to the above-described memory device, since the above-described memory element according to an embodiment of the present invention, the wiring connected to the first electrode side and the wiring connected to the second electrode side are included, and a number of the memory elements are disposed, data can be recorded and erased by applying electric current to the memory element through the wirings.

A memory device according to an embodiment of the present invention includes: a memory element having a memory layer and an ion source layer positioned between the first and second electrodes, in which the ion source layer contains any of elements selected from Cu, Ag, Zn, and any of elements selected from Te, S, Se, and the ion source layer further contains rare-earth elements and silicon; wiring connected to the first electrode side and wiring connected to the second electrode side, wherein a number of the memory elements are disposed.

According to the above-described memory device of the present invention, since the above-described memory element according to an embodiment of the present invention, the wiring connected to the first electrode side and the wiring connected to the second electrode side are included, and a number of the memory elements are disposed, data can be recorded and erased by applying electric current to the memory element from the wirings.

According to the present invention, data recording and erasure can be performed repeatedly and stably on the memory element, if heat is applied to the memory element in a high-temperature heat treatment process and the like.

Further, the memory element can be manufactured with a simplified method compared with other kinds of memory elements (such as a semiconductor memory and a ferroelectric memory).

Further, since data is recorded by means of the change in the resistance value, data can be recorded and the recorded data can be retained easily even if the memory element is made miniaturized.

Hence, according to the present invention, a memory device in which data can stably be recorded and erased and which can easily be manufactured with a comparatively simplified method is obtained.

Furthermore, a memory device can highly be integrated (high density can be obtained) and can be small-sized.

BRIEF DESCRIPTION OF THE DRAWINGS

FIG. 5A shows an electron diffraction pattern of the laminated film of a sample 6, FIG. 5B shows an electron diffraction pattern of the laminated film of a sample 7 and FIG. 5C shows an electron diffraction pattern of the laminated film of a sample 8;

DESCRIPTION OF THE PREFERRED EMBODIMENTS

Figure 1:
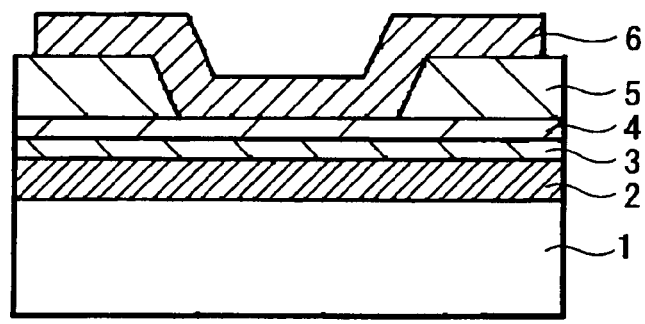
FIG. 1 is a schematic constitutional view (sectional view) of a memory element according to an embodiment of the present invention.

FIG. 1 shows, as an embodiment of the present invention, a schematic constitutional view (sectional view) of a memory element.

A memory element 10 includes: a lower electrode 2 formed on a substrate 1 having high electric conductivity such as a (P++) silicon substrate 1 doped with high-concentration P type impurities, an ion source layer 3 containing any of elements of Cu, Ag, Zn and Te, S, Se formed on the lower electrode 2, a memory thin film (memory layer) 4 formed thereon, and an upper electrode 6 formed to be connected to the memory thin film 4 through an opening formed in an insulation layer 5 on the memory thin film 4.

In the memory element 10 according to an embodiment of the present invention, the ion source layer 3 particularly contains boron (B) other than the above-described Cu, Ag, Zn and Te, S, Se.

Further, instead of containing boron (B), rare-earth elements and silicon (Si) may be contained in the ion source layer 3. As rare-earth elements, various kinds of rare-earth elements such as La, Ce, Pr, Nd, Sm, Eu, Gd, Tb, Dy, Ho, Er, Yb, Y and the like can be contained in the ion source layer 3.

Further, two kinds of elements that are boron (B) and either rare-earth elements or silicon Si may be contained in the ion source layer 3, and furthermore, those three kinds of elements, that is, boron (B), rare-earth elements and silicon (Si) may be contained in the ion source layer 3.

With those elements being contained in the ion source layer 3, stability against heat treatment, that is, thermal resistance of the memory element can be improved.

Wiring materials used in semiconductor processes such as Tiw, Ti, W, WN, Cu, Al, Mo, Ta, TaN, silicide and the like can be used as the lower electrode 2.

In the case where a Tiw film is used as the lower electrode 2, the thickness thereof is selected in the range of 10 nm to 100 nm.

Further, the ion source layer 3 can be formed of a film made of CuTe, GeSbTe, CuGeTe, AgGeTe, AgTe, ZnTe, ZnGeTe, CuS, CuGeS, CuSe, CuGeSe and the like containing at least any of Cu, Ag, Zn and at least any of chalcogenide elements of Te, S, Se, and further containing either boron or rare-earth elements and silicon.

In the case where a CuGeTeBGd film is used as the ion source layer, the thickness thereof is selected in the range of 5 nm to 50 nm.

If the memory thin film (memory layer) 4 has high resistance, for example, twice or more the ON resistance of a selective MOS transistor as a standard, sufficient memory operation can be obtained, and an insulative thin film or a semi-conductive film is used, and such as a rare-earth oxide film, rare-earth nitride film, silicon oxide film, silicon nitride film or the like is used.

The memory thin film 4 has the film thickness of 0.5 nm or more and 10 nm or less. When the memory thin film 4 is formed with such film thickness, an amorphous state can be formed stably at high temperature, and so the resistance value can be made high to be stable. Accordingly, as shown in Experiment 7 described later on, stable recording operation can be obtained.

Further, since materials for the rare-earth oxide thin film and the like are typically insulative films, the film thickness thereof can be made thin, for example, 5 nm or less to obtain a semi-conductive state.

Further, oxygen in the memory thin film 4 typically has the composition of $RE_2O_3$ with respect to a rare-earth element (RE), however, since the memory thin film 4 only needs to be an amorphous film and to have an electric property equal to or less than the conductivity of a semiconductor region, the composition is not necessarily limited to the one described above and the composition may be $REOx$ ($0.5 < X \leqq 1.5$), for example.

Further, the memory thin film 4 may contain in advance other elements such as Ge, Sb, Ti, W, Cu, Ag, Zn, Fe, Co, P, N, H, Te, S, Se or the like than rare-earth elements.

The memory thin film 4 made of the above-described materials has a characteristic that the impedance (resistance value) is changed when a voltage pulse or current pulse is applied.

As the insulation layer 5, hard-cured photoresist, $SiO_2$ and $Si_3N_4$ typically used for an semiconductor device, and other materials such as inorganic materials, fluorine-based organic materials, aromatic-based organic materials, for example, SiON, SiOF, $Al_2O_3$, $Ta_2O_5$, $HfO_2$, $ZrO_2$ or the like, can be used.

As the upper electrode 6, typical semiconductor wiring materials are used similarly to the lower electrode 2.

Note that, in the memory element 10 shown in FIG. 1, the memory thin film 4 is formed on the ion source layer 3, however, the ion source layer 3 may be formed on the memory thin film 4.

Further, an electrode layer may be laminated directly on the memory thin film 4 and the upper electrode 6 may be formed by patterning the electrode layer into a predetermined pattern.

The memory element 10 according to an embodiment of the present invention can be operated as follows, and data is recorded therein.

First, positive electric potential (+potential), for example, is applied to the ion source layer 3 containing Cu, Ag, Zn, and positive voltage is applied to the memory element 10 such that the side of the upper electrode 6 becomes negative. With this, Cu, Ag, Zn are ionized from the ion source layer 3 to diffuse in the memory thin film 4 and are combined with electrons on the side of the upper electrode 6 to be deposited, or to remain in the memory thin film 4 in the diffused state.

Then, since a current path containing a large amount of Cu, Ag, Zn is formed in the memory thin film 4 or a large number of defects caused by Cu, Ag, Zn are formed in the memory thin film 4, the resistance value of the memory thin film 4 becomes low. Since a resistance value of each layer other than the memory thin film 4 is originally low in comparison with the resistance value of the memory thin film 4 before recording, the resistance value of the whole memory element 10 can also be lowered by lowering the resistance value of the memory thin film 4.

After that, when the positive voltage is removed to make the voltage applied to the memory element 10 eliminated, the memory element 10 is kept in a state where the resistance value is lowered. Hence, data can be recorded. When the memory element is used in a memory device capable of recording only once, that is, a PROM, the recording is finished only with the recording process as described above.

On the other hand, on application to a memory device capable of erasing data, specifically, on application to a RAM, EEPROM or the like, an erasing process is needed, in which a negative potential (− potential), for example, is applied to the ion source layer 3 containing Cu, Ag, Zn and a negative voltage is applied to the memory element 10 such that the side of the upper electrode 6 becomes positive. With this, Cu, Ag, Zn constituting the current path or impurity level formed in the memory thin film 4 are ionized and move in the memory thin film 4 to return to the side of the ion source layer 3.

Then, the current path or defects caused by Cu, Ag, Zn disappear in the memory thin film 4, and the resistance value of the memory thin film 4 becomes high. Since the resistance value of each layer other than the memory layer 4 is originally low, the resistance value of the whole memory element 10 can also be raised by making the resistance value of the memory thin film 4 high.

After that, when the negative voltage is removed and the voltage applied to the memory element 10 is eliminated, the memory element 10 can be kept in a state where the resistance value is raised. Accordingly, it becomes possible to erase the recorded data.

By repeating such process, data recording (writing) and erasure of recorded data can be performed repeatedly in the memory element 10.

Further, since the ion source layer 3 particularly contains elements selected from Te, S, Se, that is, chalcogen elements in addition to the above-described metal elements (Cu, Ag, Zn), the metal elements (Cu, Ag, Zn) and the chalcogen elements (Te, S, Se) in the ion source layer 3 are combined to make a metal chalcogenide layer. The metal chalcogenide layer mainly has an amorphous structure, and when a positive potential, for example, is applied to the side of the lower electrode 2 in contact with the ion source layer 3 made of the metal chalcogenide layer, the metal elements (Cu, Ag, Zn) contained in the metal chalcogenide layer are ionized to be diffused in the memory thin film 4 of high resistance and are combined with electrons at a portion on the side of the upper electrode 6 to be deposited or to remain in the memory thin film 4 forming an impurity level of an insulation layer, thereby making resistance of the memory thin film 4 low to perform data recoding.

Subsequently, when a negative potential is applied to the side of the lower electrode 2 in contact with the ion source layer 3 made of the metal chalcogenide layer, the metal elements (Cu, Ag, Zn) that have been deposited on the side of the upper electrode 6 are again ionized and return to the metal chalcogenide layer, and so the resistance of the memory thin film 4 returns to the state of original high resistance and the resistance of the memory element 10 also becomes high, thereby performing the erasure of recorded data.

Further, when the state of high resistance value is made to correspond to information of "0" and the state of low resistance value is made to correspond to information of "1", respectively, for example, it is possible to change from "0" to "1" in the data recording process by applying the positive voltage and to change from "1" to "0" in the data erasing process by applying the negative voltage.

Note that, typically the memory thin film 4 has high resistance in the initial state before recording, however, may have low resistance of the recorded state in the initial state by means of a plasma treatment, annealing treatment and the like in the process.

The resistance value after the recording is dependent on recording conditions such as the width of the voltage pulse or of the current pulse which are applied at the time of recording and the amount of current rather than the cell size and the material composition of the memory thin film 4 of a memory element 10, and the resistance value after the recording is in the approximate range of $50\Omega$ to $50\ k\Omega$ in the case where the initial resistance value is $100\ k\Omega$ or more.

In order to demodulate the recorded data, the ratio of the resistance value in the initial state to the resistance value after the recording only needs to be approximately twofold or more such that a resistance value before recording is $100\Omega$ and a resistance value after the recording is $50\Omega$, or a resistance value before recording is $100\ k\Omega$ and a resistance value after recording is $50\ k\Omega$, and the initial resistance value of the memory thin film 4 is selected to satisfy such conditions. The resistance value of the memory thin film 4 can be determined by adjusting the oxygen concentration, film thickness, area of the memory thin film 4 and by adding an impurity material, for example.

According to the structure of the above-described memory element 10 of this embodiment, since the ion source layer 3 and memory thin film 4 are positioned between the lower electrode 2 and upper electrode 6, a current path containing a large amount of Cu, Ag, Zn is formed in the memory thin film 4 or a large number of defects are formed in the memory thin film 4 in the case where a positive voltage (+ potential), for example, is applied to the side of the ion source layer 3 to make the side of the upper electrode 6 negative, so that the resistance value of the memory thin film 4 becomes low and therefore the resistance value of the whole memory element 10 becomes low. Then, when the application of the positive voltage is stopped and no voltage is applied to the memory element 10, the state of low resistance is retained to be capable of recording data. This kind of structure is used in a memory device of PROM or the like in which the recording can be performed only once.

Further, data is recorded using the change in a resistance value of the memory element 10, particularly using the change in a resistance value of the memory thin film 4, and so the recording of data and retention of recorded data can be performed without difficulties in the case where the memory element is further miniaturized.

Further, when using the above memory element in a memory device of, for example, RAM, EEPROM or the like in which erasure of data can be performed in addition to recording, a negative voltage (− potential), for example, is applied to the ion source layer 3 in the above-described memory element 10 in the state after the recording to make the side of the upper electrode side 6 positive. With this, the current pass made of Cu, Ag, Zn or defects formed in the memory thin film 4 disappear to make the resistance value of the memory thin film 4 high and the resistance value of the whole memory element 10 becomes high. Then, with the application of the negative voltage being stopped and no voltage being applied to the memory element 10, the state of high resistance value is retained and the recorded data can be erased.

Further, according to the memory element 10 of this embodiment, since the ion source layer contains boron (B) or contains rare-earth elements and silicon (Si), the ion source layer 3 can be made uniformly amorphous or can be made into a microcrystal structure in which the particle diameter is extremely small and uniform.

With the above-described structure, the microscopic structure of the ion source layer 3 is maintained stably and the film state of the ion source layer 3 (such as a surface state) is maintained in a favorable state, even if heat is applied to the memory element 10 in the heat treatment process or the like. In other words, the microscopic structure of the ion source layer 3 is maintained stably against the heat treatment process in semiconductor processes, particularly required in a wiring process.

Further, since the film state (such as a surface state) of the ion source layer 3 is maintained in a favorable state, an electric field can be distributed uniformly in the memory thin film 4 and dispersion of the voltage threshold value (switching voltage) when the memory element 10 is changed from a high resistance state to a low resistance state can be reduced, an equal value can be obtained even if recording and erasure are repeatedly performed.

Accordingly, the ion source layer 3 and the memory thin film (memory layer) 4 can be maintained in a favorable state after high-temperature heat treatment was performed, and so the thermal resistance of the memory element 10 can be improved.

Further, according to the memory element 10 of this embodiment, each of the lower electrode 2, ion source layer 3, memory thin film 4 and upper electrode 6 can be made of a material capable of being sputtered. For example, using a target which has a composition applicable as a material to each layer, sputtering can be performed.

Further, by exchanging a target in the same sputtering apparatus, layers can be formed successively.

Note that in the memory element 10 of the above-described embodiment, in the case where a film made of rare-earth oxide (rare-earth oxide thin film) is formed as a portion of the memory thin film 4, the oxide thin film can be formed by a method using an oxide sputtering target, a method using a metal target and introducing oxygen as well as inert gas, for example, argon as introduction gas in sputtering, that is, a reactive sputtering method or the like.

Furthermore, the oxide thin film can also be formed by a CVD method, deposition method or the like other than sputtering, and further the oxide thin film can be formed by using a material that is in the metal state when forming a film and thereafter becomes an oxide thin film by means of thermal oxidation, chemical treatment or the like.

The memory element 1 of FIG. 1 can be manufactured, for example, as follows.

First, on the substrate 1 having a high electric conductivity, for example, a silicon substrate in which high concentration P-type impurity is doped, the lower electrode 2, for example, a TaN film is deposited.

Next, the ion source layer 3, for example, a CuTeGeBSiGd film is formed, and after that, the memory thin film 4, for example, a $Gd_2O_3$ film is formed.

After that, the insulation layer 5 is formed to cover the memory thin film 4, and a part of the insulation layer 5 is removed by photolithography to form a contact portion to the memory thin film 4.

Subsequently, as the upper electrode 6, for example, a tungsten (W) film is formed using a magnetron sputtering apparatus, for example.

After that, patterning is performed on the tungsten (W) film by plasma etching or the like. Other etching methods than the plasma etching, such as ion milling, RIE (Reactive Ion Etching) or the like can also be used for patterning.

As described above, the memory element 10 shown in FIG. 1 can be manufactured.

A memory device (memory) can be formed by using a number of the above-described memory elements 10 of this embodiment to be disposed in column shape or matrix shape.

Wiring connected to the side of the lower electrode 2 and wiring connected to the side of the upper electrode 6 are provided with respect to each of the memory elements 10, and each memory element 10 may be disposed in the vicinity of an intersection of those wirings, for example.

Specifically, the lower electrode 2 is formed to be common to memory cells in the row direction and the wiring connected to the upper electrode 6 is formed to be common to memory cells in the column direction, for example, and a memory cell where recording should be performed is determined by selecting the lower electrode 2 and wiring in which an electric potential is applied to make a current flow; and then a current is made to flow in the memory element 10 in the memory cell to perform recording of data and erasure of the recorded data.

According to the memory element 10 of the above-described embodiment, data recording and data erasure can be performed easily and stably, and particularly the memory element has an advantage in stability when retaining data under a high-temperature environment for a long period of time.

Further, data recording and retention of the recorded data can be performed easily, in the case where the above-described memory element 10 of this embodiment becomes miniaturized.

Accordingly, when the above-described memory element 10 of this embodiment is used to form a memory device, integration (high density) and miniaturization of the memory device can be facilitated.

[Practice Examples]

Next, a laminated film according to an embodiment of the present invention was manufactured and the characteristic thereof was studied.

[Structural Analysis Based on X-ray Diffraction]

On a silicon wafer as a substrate was formed each layer of a lower electrode, an ion source layer and a memory thin film to form a laminated film constituting a memory element.

First, a TaN film of 20 nm in thickness was formed as the lower electrode, a $Cu_{53}Te_{28}Ge_{12}Gd_7$ film (numerals denote atom %) of 20 nm in thickness was formed as the ion source layer, and a $Gd_2O_3$ film of 2.4 nm in thickness was formed as the memory thin film, to obtain a laminated film of a sample 1.

Next, a TaN film of 20 nm in thickness was formed as the lower electrode, a $Cu_{44}Te_{25}Ge_6Si_{14}B_5$ film (numerals denote atom %) of 20 nm in thickness was formed as the ion source layer, and a $Gd_2O_3$ film of 2.4 nm in thickness was formed as the memory thin film, to obtain a laminated film of a sample 2.

Next, a TaN film of 20 nm in thickness was formed as the lower electrode, a $Cu_{45}Te_{27}Ge_7Gd_6Si_{15}$ film (numerals denote atom %) of 20 nm in thickness was formed as the ion source layer, and a $Gd_2O_3$ film of 2.4 nm in thickness was formed as the memory thin film, to obtain a laminated film of a sample 3.

Next, a TaN film of 20 nm in thickness was formed as the lower electrode, a $Cu_{45}Te_{27}Ge_7µl_5B_6$ film (numerals denote atom %) of 20 nm in thickness was formed as the ion source layer, and a $Gd_2O_3$ film of 2.4 nm in thickness was formed as the memory thin film, to obtain a laminated film of a sample 4.

Next, a TaN film of 20 nm in thickness was formed as the lower electrode, a $Cu_{42}Te_{24}Ge_6Gd_6Si_{14}B_8$ film (numerals denote atom %) of 20 nm in thickness was formed as the ion source layer, and a $Gd_2O_3$ film of 2.4 nm in thickness was formed as the memory thin film, to obtain a laminated film of a sample 5.

With respect to those samples, patterning was not performed in the state in which the laminated film had been formed.

Among those samples, each of the samples 2 to 5 has a structure according to a practice example of the memory element of the present invention, and the sample 1 has a structure of a comparative example.

Next, with respect to the laminated film of the sample 1, X-ray diffraction intensity was measured using an X-ray diffraction apparatus, immediately after the film was formed and after the memory thin film was formed where air had been evacuated to be a vacuum and then replaced with nitrogen atmosphere to perform heat treatment in the nitrogen atmosphere at 280° C. for an hour, respectively, and the surface roughness Ra of the film was measured using AFM (Atomic Force Microscope).

Figure 2:
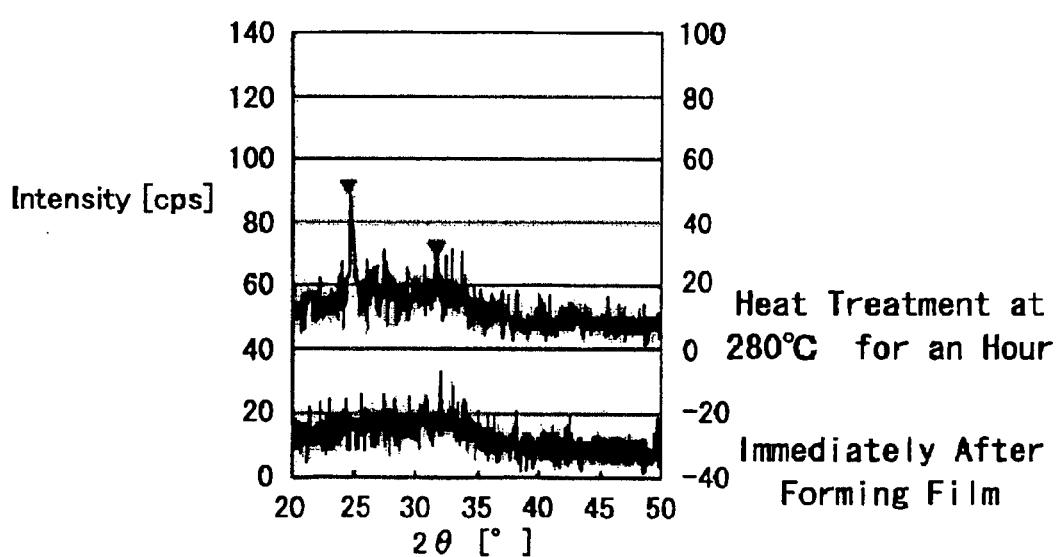
FIG. 2 shows measurement results of X-ray diffraction immediately after forming a laminated film of a sample 1 and after the heat treatment thereto.

FIG. 2 shows the measurement results of X-ray diffraction.

It is understood from FIG. 2 that any peak having a specific angle was not recognized immediately after the film was formed, and after the heat treatment was performed, the peak was recognized to show that the microscopic structure of the film was changed by crystallization.

Further, the surface roughness Ra of the film, which was 0.23 nm immediately after forming the film, became 0.35 nm after the heat treatment, which implies that the microscopic structure was locally changed by the locally facilitated crystallization due to the heat treatment and accordingly microscopic shape of the surface was also changed.

As reference data compared with the above, the surface roughness Ra of a silicon wafer whose surface is covered with a natural oxidation film was measured, and the measurement result thereof was 0.14 nm.

Next, with respect to the laminated film of the sample 2, a sample (2A) immediately after forming the film, a sample (2B) on which heat treatment was performed in nitrogen atmosphere at 400° C. for an hour after being immersed in TMAH (tetramethylammonium hydroxide) and a sample (2C) on which heat treatment was performed in nitrogen atmosphere at 400° C. for an hour without any chemical treatment were made, and the X-ray diffraction intensity of each of the samples (2A) to (2C) was measured using an X-ray diffraction apparatus and the surface roughness Ra thereof was measured using AFM.

Figure 3:
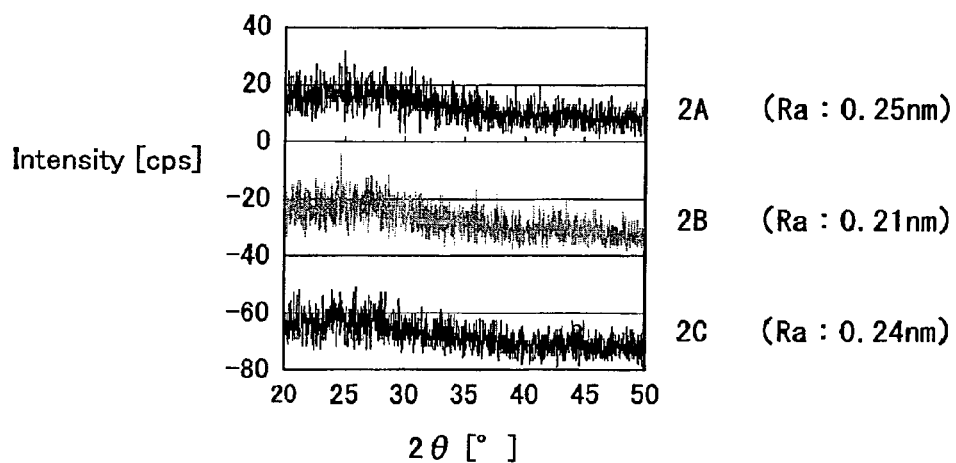
FIG. 3 shows measurement results of X-ray diffraction and measured values of surface roughness with respect to three samples of a sample 2 whose treating conditions of the laminated film are different to each other.

FIG. 3 shows measurement results. In FIG. 3, on the right side of the X-ray diffraction intensity are described sample names (2A to 2C) and the measurement values of the surface roughness Ra.

It is understood from FIG. 3 that with respect to the sample (2C) on which heat treatment in nitrogen atmosphere at 400° C. for an hour was performed, an X-ray diffraction peak is not shown, though the heat treatment was performed at higher temperature compared with the sample 1 in FIG. 2, and the amorphous structure was maintained. Regarding surface roughness Ra, an excellent value equivalent to that of the sample 2A immediately after forming the film was obtained.

Hence, it is assumed that no problem, in which the microscopic structure of the film is changed to deteriorate the characteristic, occurs in the case where size of the element is miniaturized to be approximately 50 nm or less.

Further, in the sample 2B to which chemical treatment was performed, the surface roughness Ra was improved as compared with the sample 2A immediately after forming the film, and the surface nature can be improved by performing heat treatment, for example, after chemical oxidation-reduction reaction was performed.

Next, with respect to each laminated film of the samples 3 to 5, a sample on which heat treatment in nitrogen atmosphere at 400° C. for an hour was performed was made, and X-ray diffraction intensity was each measured using an X-ray diffraction intensity apparatus and the surface roughness Ra was measured using AFM.

Figure 4:
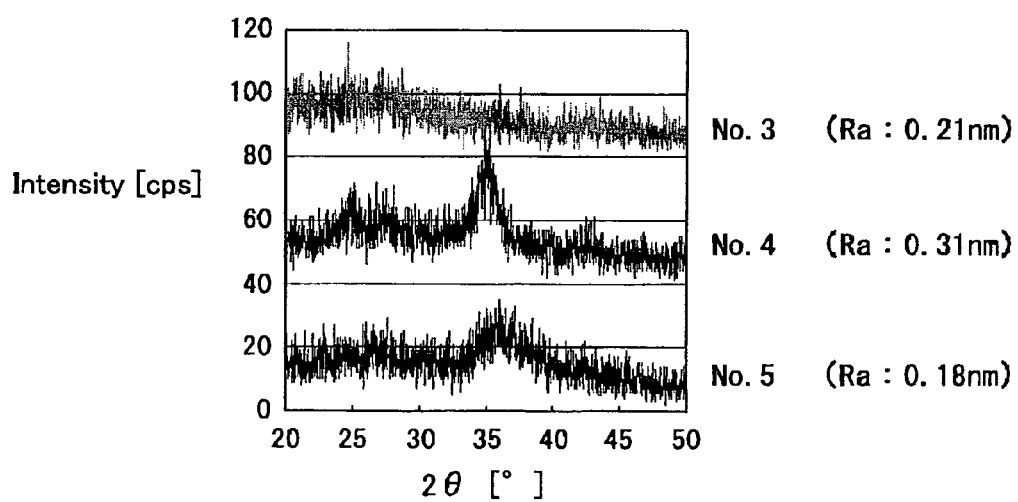
FIG. 4 shows measurement results of X-ray diffraction and measured values of surface roughness with respect to the laminated film of samples 3 to 5.

FIG. 4 shows measurement results. In FIG. 4, on the right side of the X-ray diffraction intensity are described sample numbers (No. 3 to No. 5) and measurement results of the surface roughness Ra.

It is understood from FIG. 4 that since rare-earth elements, silicon and further boron (B) are added to the ion source layer whose main component is CuTe, crystallization after the high temperature heat treatment can be controlled not to be facilitated.

With respect to the sample 4, although an X-ray diffraction peak was recognized, it is understood that stability at high temperature was improved as compared with the sample 1 shown in FIG. 2 in consideration of treatment at a high temperature of 400° C. and the value of surface roughness Ra.

Further, with respect to the sample 5, although a broad X-ray diffraction peak was recognized, it is assumed to be caused by microcrystal of boron and since the surface roughness Ra after the heat treatment was excellent, no problem would be raised when practically used.

[Observation of Film-Section Structure with Transmission Electron Microscope]

On a silicon substrate whose surface was covered with a natural oxidation film was formed each layer of a lower electrode, an ion source layer and a memory thin film to form a laminated film constituting a memory element.

First, a WN film of 20 nm in thickness was formed as the lower electrode, a $Cu_{54}Te_{32}Ge_8Gd_6$ film (numerals denote atom %) was formed as the ion source layer, and a GdN film of 2.8 nm in thickness was formed as the memory thin film, to obtain a laminated film of a sample 6.

Next, a WN film of 20 nm in thickness was formed as the lower electrode, a $Cu_{45}Te_{27}Ge_7Gd_6B_{16}$ film (numerals denote atom %) was formed as the ion source layer, and a GdN film of 2.8 nm in thickness was formed as the memory thin film, to obtain a laminated film of a sample 7.

Next, a WN film of 20 nm in thickness was formed as the lower electrode, a $Cu_{39}Te_{23}Ge_6Gd_5Si_{16}B_{13}$ film (numerals denote atom %) was formed as the ion source layer, and a GdN film of 2.8 nm in thickness was formed as the memory thin film, to obtain a laminated film of a sample 8.

With respect to those samples, patterning was not performed in the state in which the laminated film had been formed. In addition, the thickness of the ion source layer was selected in the range of 25 nm to 30 nm.

Among those samples, each of the samples 7 and 8 has a structure according to a practice example of a memory element of the present invention, and the sample 6 has a structure of a comparative example.

After heat treatment in nitrogen atmosphere at 280° C. for an hour was performed on each laminated film of the samples 6 to 8, section of each laminated film was observed using a transmission electron microscope and an electron diffraction pattern was obtained.

FIGS. 5A to 5C show the obtained electron diffraction patterns. FIG. 5A shows the electron diffraction pattern of the sample 6, FIG. 5B shows that of the sample 7 and FIG. 5c shows that of the sample 8.

It is understood from the observation result of the section and the electron diffraction pattern shown in FIG. 5A that in the sample 6 the ion source layer was crystallized and the local microscopic structure was not uniform.

On the contrary, it is understood from the observation result of the section and the electron diffraction pattern shown in FIG. 5B that in the sample 7, to which boron B was added, the microscopic structure was uniform and the pattern of concentric circles specific to the amorphous structure was obtained as the electron diffraction pattern. The same result was obtained with respect to the sample 8.

Next, the above-described memory element 10 according to an embodiment of the present invention was manufactured practically and the characteristics thereof were studied.

[Experiment 1]

On a silicon substrate, a WN film of 20 nm in thickness was deposited as the lower electrode 2, a $Cu_{61}Te_{21}Ge_5B_8$ film was formed thereon as the ion source layer 3, an GdN film of 2.5 nm in thickness was formed as the memory thin film 4 and photoresist was formed to cover the surface, and after that, exposure and development were performed by means of photolithography to form an opening (through hole) in the photoresist on the memory thin film 4.

After that, air was evacuated to be a vacuum and then replaced with nitrogen atmosphere to perform annealing treatment in the nitrogen atmosphere and the photoresist was transformed to be the insulation layer 5 as hard-cured resist which is stable with respect to temperature, etching and the like. It should be noted that hard-cured resist was used as the insulation layer 5 because of convenience to be formed in simple and easy manner in the experiment, and when manufacturing commercial products, it is preferable that other materials (such as silicon oxide film) is used as the insulation layer 5.

Next, a tungsten (W) film of 90 nm in thickness was formed as the upper electrode 6. After that, by means of photolithography using a plasma etching apparatus, patterning was performed on the upper electrode 6 deposited on the insulation layer 5 made of hard-cured resist. Further, laminated films 2, 3 and 4 are patterned in circular shape of 0.7 μm in diameter.

The memory element 10 having such a structure was manufactured to be a sample 9.

Further, a $Cu_{53}Te_{21}Ge_5B_{20}$ film was formed as the ion source layer 3, and a memory element of a sample 10 was obtained in which the other structure was similar to the sample 9.

After performing heat treatment in the nitrogen atmosphere at 280° C. with respect to those samples 9 and 10, I-V characteristic was measured, respectively.

I-V measurement was performed as follows.

With respect to the memory element of each sample, the rear surface of the low resistance silicon substrate 1 conducted to the lower electrode 2 was connected to the ground potential and a negative potential (− potential) was applied to the upper electrode 6.

Then, the negative potential applied to the upper electrode 6 was reduced from 0V and the change in the current was measured. However, settings had been made that a current limiter would operate when the current reached 1 mA and the negative potential applied to the upper electrode 6, that is, the absolute value of the voltage applied to the memory element was prevented from increasing further more.

Further, from the state in which the current had reached 1 mA and the current limiter was operated, the negative voltage applied to the upper electrode 6 was reduced to 0V and the change in the current was measured. Subsequently, at this time, a positive potential was applied to the upper electrode on the contrary, and after the positive voltage was made to increase until the current decreased not to flow, the potential was returned to 0 potential.

Figure 6A:
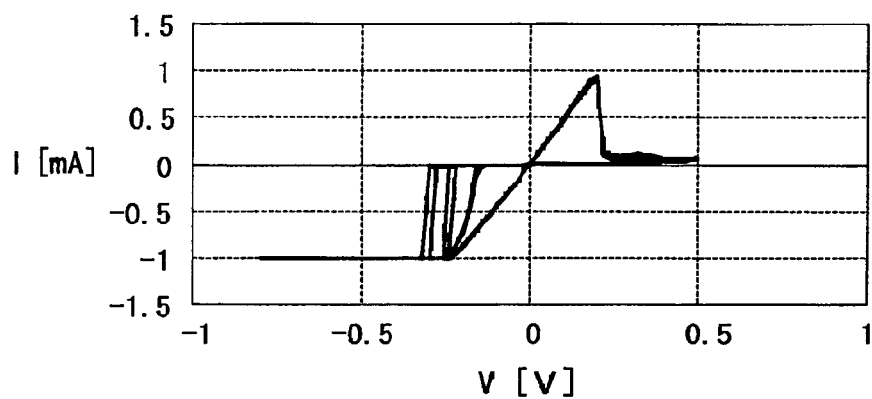
FIG. 6A shows measurement results of I-V characteristic of a memory element of a sample 9 and FIG. 6B shows measurement results of I-V characteristic of a memory element of a sample 10.
Figure 6B:
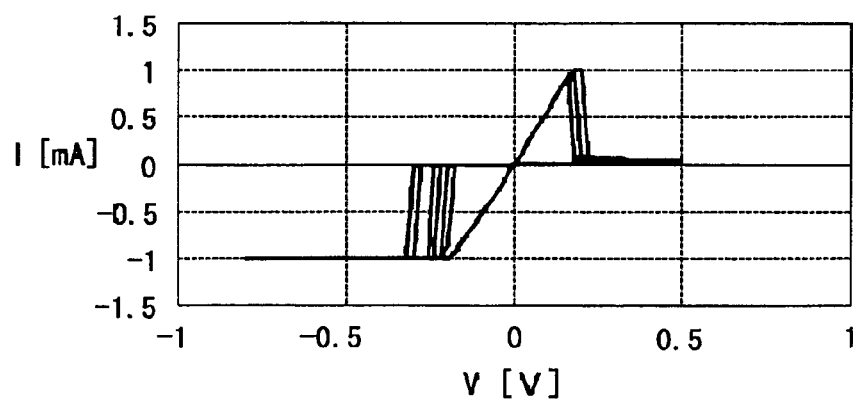

FIGS. 6A and 6B show measurement results of the I-V characteristic obtained as described above. FIG. 6A shows a measurement result of the sample 9 and FIG. 6B shows that of the sample 10.

In FIGS. 6A and 6B, since the initial resistance value was high, the memory element was in the OFF state and the voltage was made to increase in the negative direction, electric current was made to increase rapidly when the voltage became a certain threshold voltage (Vth) or more. Specifically, the resistance value became low and the memory was transited to the ON state. With this, data was recorded.

On the other hand, after that, when the voltage was reduced, a constant resistance value was maintained. Specifically, the memory element was kept to be in the ON state and the recorded data was maintained.

Further, when the rear surface of the low resistance silicon substrate 1 was connected to the ground potential and a positive potential (+potential), which is the voltage of reverse polarity to the above, of V=0.2V or more was applied to the upper electrode 6 and then the potential applied to the upper electrode 6 was returned to 0V, it is confirmed that the resistance value of the memory element was returned to the initial OFF state of high resistance. In other words, data recorded in the memory element can be erased when applying the negative voltage.

Accordingly, it was confirmed that data recording and data erasure can be performed favorably.

[Experiment 2]

A $Cu_{61}Te_{27}Ge_7Gd_5$ film was formed as the ion source layer 3, and a memory element 10 of a sample 11 was obtained in which the other structure was similar to the sample 9.

Further, a $Cu_{56}Te_{25}Ge_6Gd_5B_8$ film was formed as the ion source layer 3, and a memory element 10 of a sample 12 was obtained in which the other structure was similar to the sample 9.

Further, a $Cu_{51}Te_{23}Ge_6Gd_5B_{15}$ film was formed as the ion source layer 3, and a memory element 10 of a sample 13 was obtained in which the other structure was similar to the sample 9.

Further, a $Cu_{49}Te_{21}Ge_5Gd_4B_{20}$ film was formed as the ion source layer 3, and a memory element 10 of a sample 14 was obtained in which the other structure was similar to the sample 9.

Among those samples, each of the samples 12 to 14 has a structure according to a practice example of the memory element of the present invention, and the sample 11 has a structure of a comparative example.

Figure 7A:
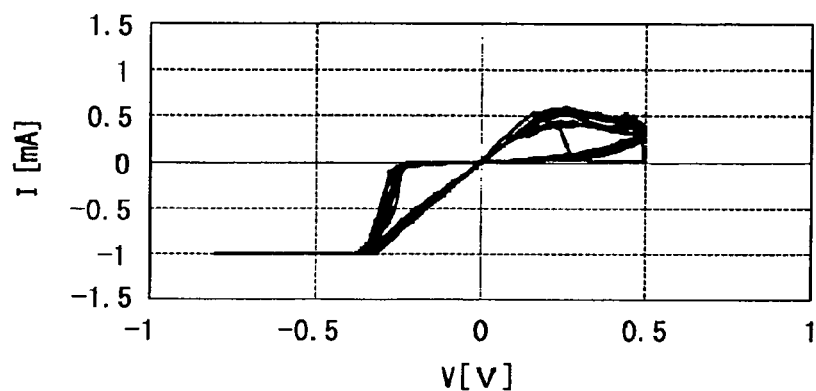
FIGS. 7A to 7C show measurement results of I-V characteristic of a memory element of three cells of a sample 11.
Figure 7B:
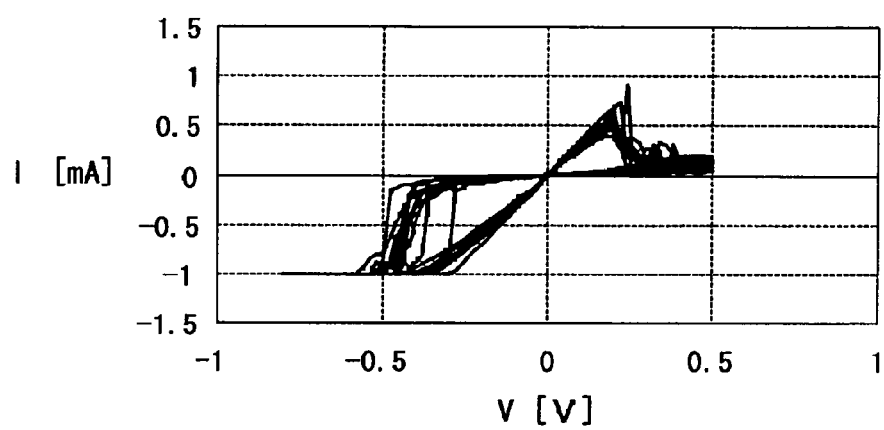
Figure 7C:
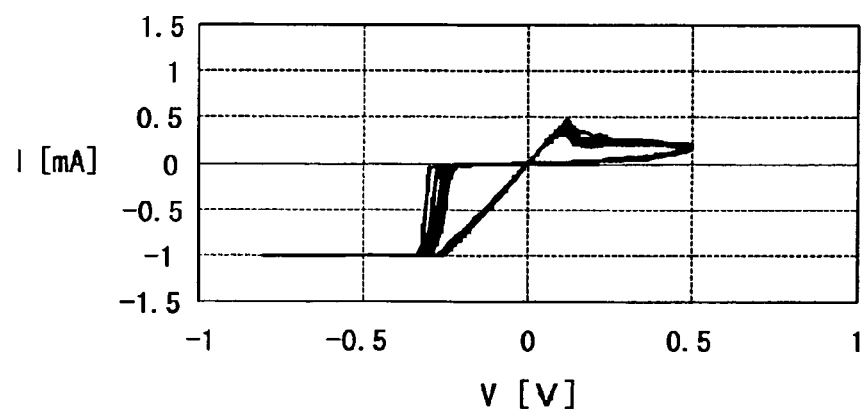
Figure 8A:
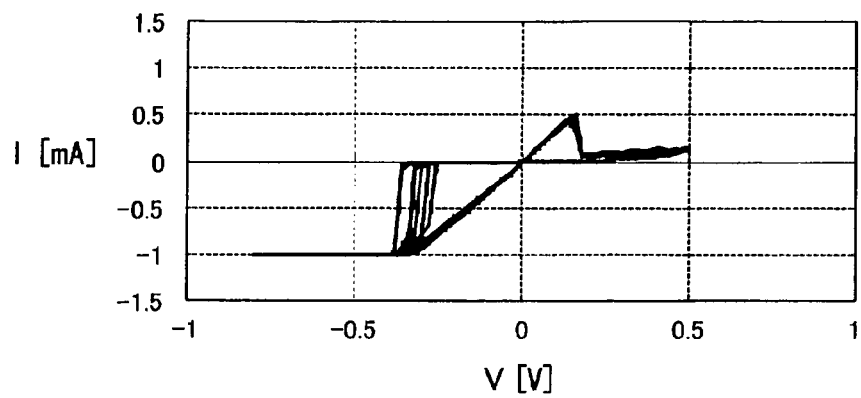
FIGS. 8A to 8C show measurement results of I-V characteristic of a memory element of three cells of a sample 12.
Figure 8B:
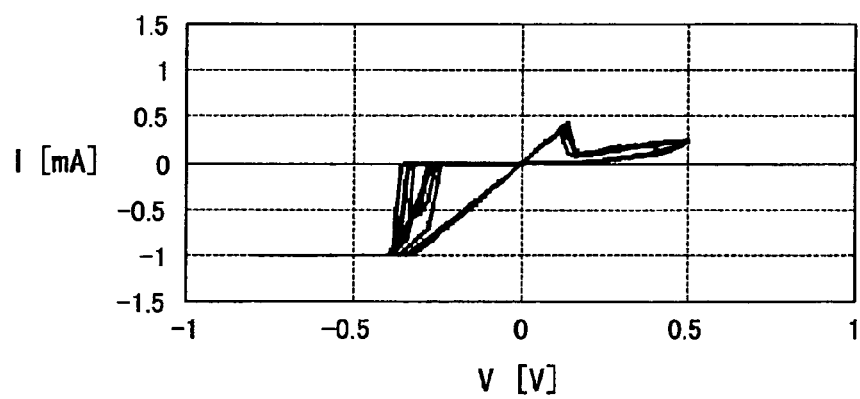
Figure 8C:
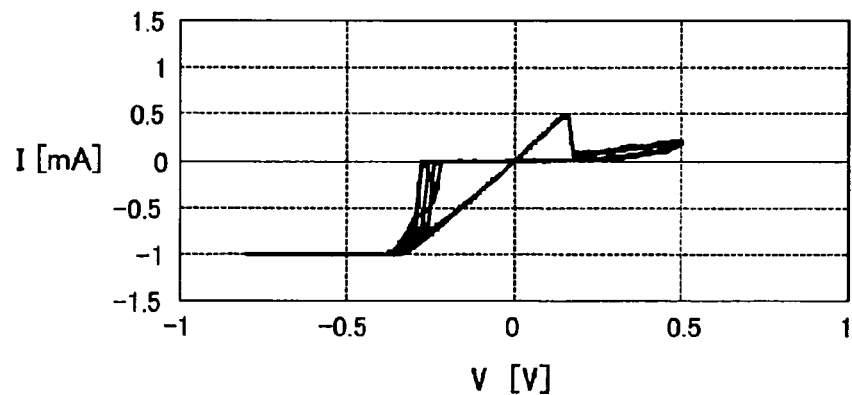
Figure 9A:
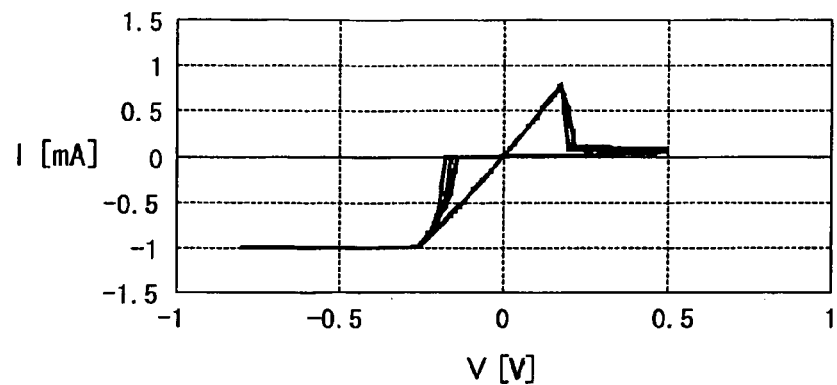
FIGS. 9A to 9C show measurement results of I-V characteristic of a memory element of three cells of a sample 13.
Figure 9B:
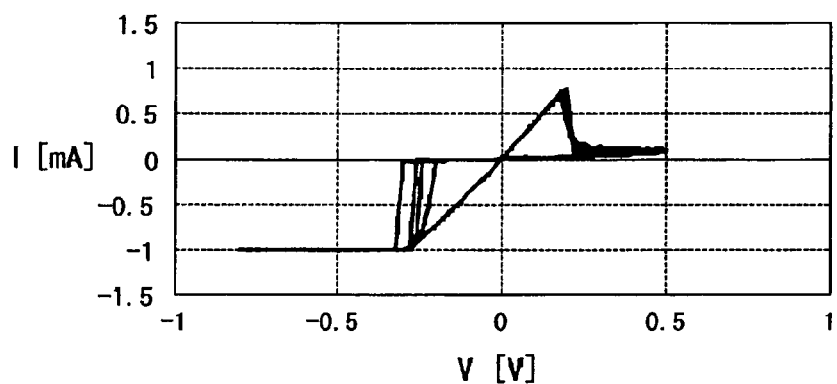
Figure 9C:
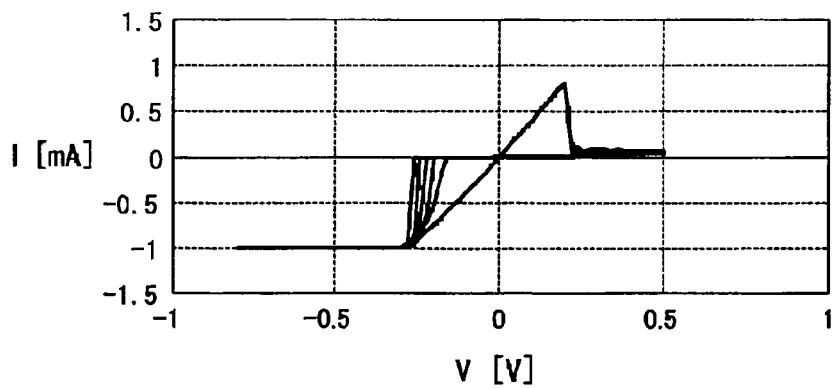
Figure 10A:
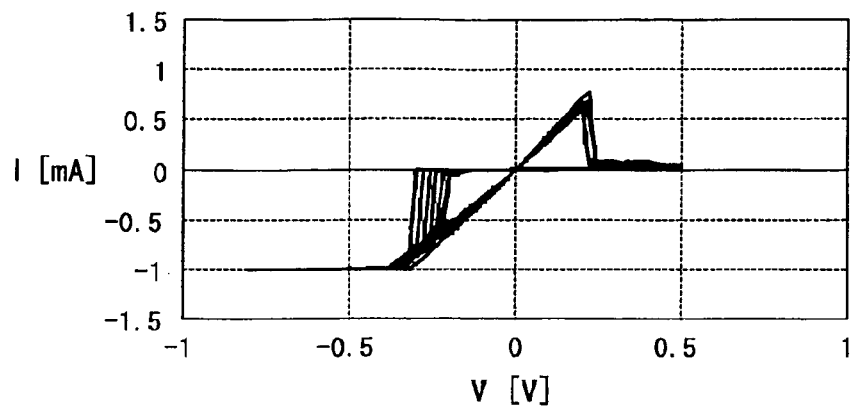
FIGS. 10A to 10C show measurement results of I-V characteristic of a memory element of three cells of a sample 14.
Figure 10B:
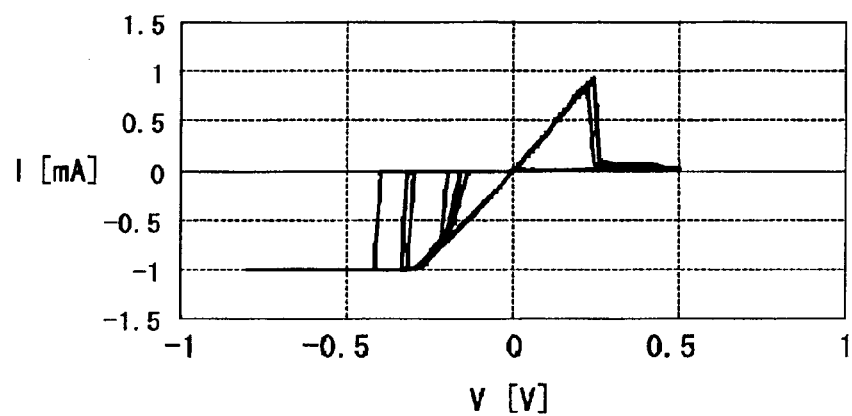
Figure 10C:
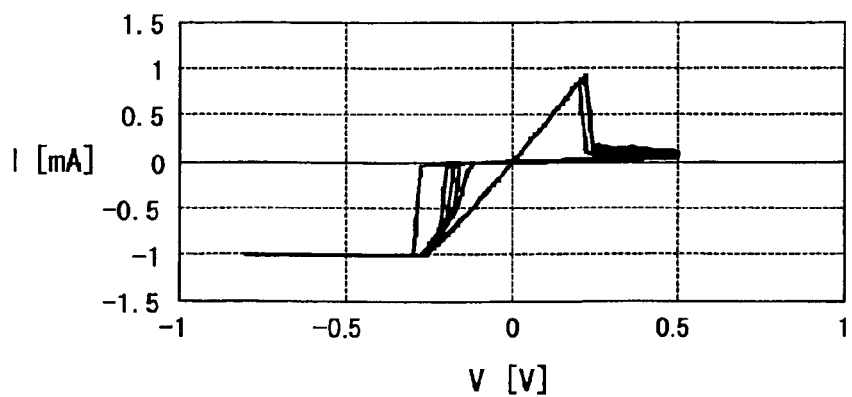

After the heat treatment in nitrogen atmosphere at 350° C. was performed on each memory element of those samples 11 to 14, I-V characteristic of the memory element of three different cells made in the same wafer was measured with respect to each sample and dispersion of the I-V characteristic was studied. FIGS. 7A to 7C show measurement results of the sample 11, FIGS. 8A to 8C show those of the sample 12, FIGS. 9A to 9C show those of the sample 13, and FIGS. 10A to 10C show those of the sample 14.

As shown in FIGS. 7A to 7C, in the sample 11 that is a comparative example, I-V characteristics of the three cells in the same wafer were dispersed, though the condition of forming the film was the same. Further, particularly in the cell shown in FIG. 7A, electric current of 0.35 mA or more flowed in the erasure state, which is assumed to be caused by the fact that the microscopic film structure was changed due to the heat treatment in nitrogen atmosphere at 350° C. and the structure of the memory thin film (memory layer) was also changed to make the film thickness thin.

On the contrary, as shown in FIGS. 8A to 10C, in the samples 12 to 14 that are practice examples of the present invention, dispersion with respect to I-V characteristics of the three cells in the same wafer was small, and a stable characteristic was obtained.

Further, when FIGS. 7 to 10 are compared in order, current in the erasure state becomes small as the amount of boron (B) increases, and it is assumed that with the addition of boron, thermal stability of the microscopic structure of the ion source layer is improved.

[Experiment 3]

A memory element in which the ion source layer 3 contains rare-earth elements and silicon (Si) was made and the I-V characteristic was studied.

A $Cu_{51}Te_{31}Ge_8Gd_6Si_4$ film was formed as the ion source layer 3, and a memory element 10 of a sample 15 was obtained in which the other structure was similar to the sample 9.

Further, a $Cu_{48}Te_{28}Ge_7Gd_6Si_{12}$ film was formed as the ion source layer 3, and a memory element 10 of a sample 16 was obtained in which the other structure was similar to the sample 9.

Further, a $Cu_{40}Te_{24}Ge_6Gd_5Si_{26}$ film was formed as the ion source layer 3, and a memory element 10 of a sample 17 was obtained in which the other structure was similar to the sample 9.

Figure 11A:
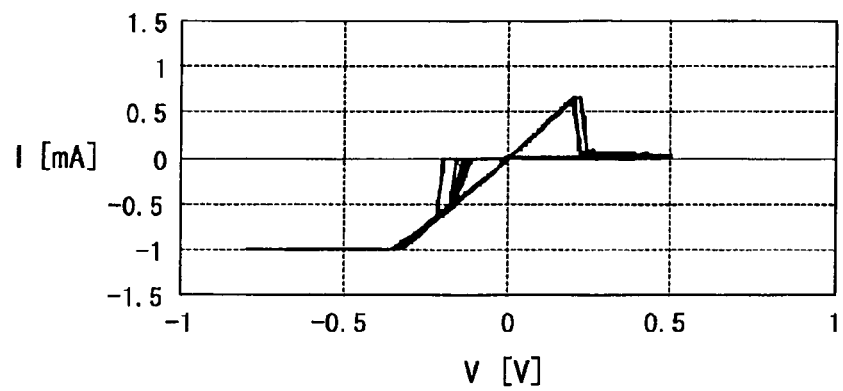
FIG. 11A shows measurement results of I-V characteristic of a memory element of a sample 15.

After the heat treatment in nitrogen atmosphere at 280° C. was performed on each memory element of those samples 15 to 17, I-V characteristic was measured. Measurement results of the I-V characteristic were shown in FIG. 11A to 11C. FIG. 11A shows measurement results of the sample 15, FIG. 11B shows those of the sample 16, and FIG. 11C shows those of the sample 17.

Figure 11B:
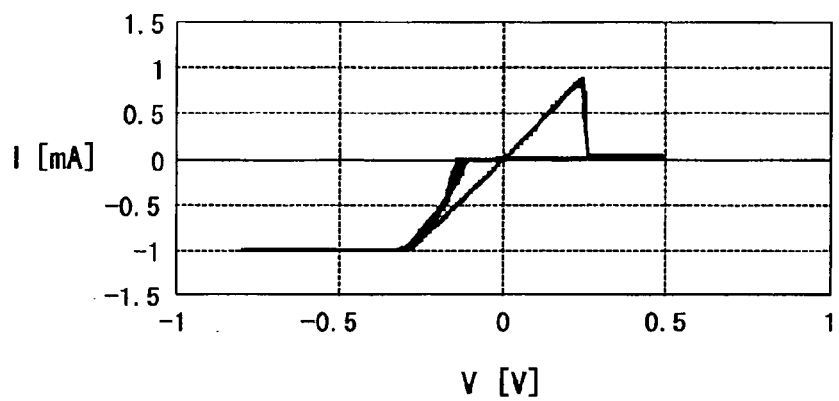
FIG. 11B shows measurement results of I-V characteristic of a memory element of a sample 16.
Figure 11C:
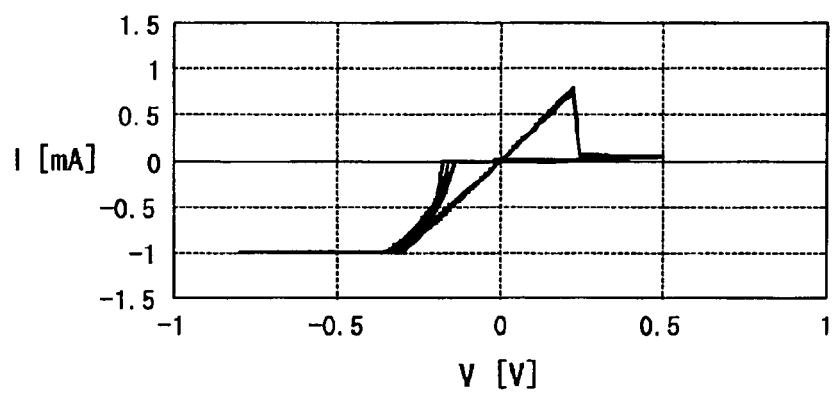
FIG. 11C shows measurement results of I-V characteristic of a memory element of a sample 17.

As shown in FIGS. 11A to 11C, each of the samples 15 to 17, in which rare-earth elements and silicon (Si) were contained in the ion source layer, has a favorable I-V characteristic after the heat treatment, similarly to the sample in which boron (B) is contained in the ion source layer.

[Experiment 4]

A memory element in which the ion source layer 3 contains boron (B), rare-earth elements and silicon (Si) was made and the I-V characteristic was studied.

A $Cu_{44}Te_{26}Ge_7Gd_5Si_{11}$ film was formed as the ion source layer 3, and a memory element 10 of a sample 18 was obtained in which the other structure was similar to the sample 9.

Further, a $Cu_{41}Te_{25}Ge_6Gd_5B_{13}Si_{10}$ film was formed as the ion source layer 3, and a memory element 10 of a sample 19 was obtained in which the other structure was similar to the sample 9.

Further, a $Cu_{39}Te_{23}Ge_6Gd_5B_{18}Si_{10}$ film was formed as the ion source layer 3, and a memory element 10 of a sample 20 was obtained in which the other structure was similar to the sample 9.

Figure 12A:
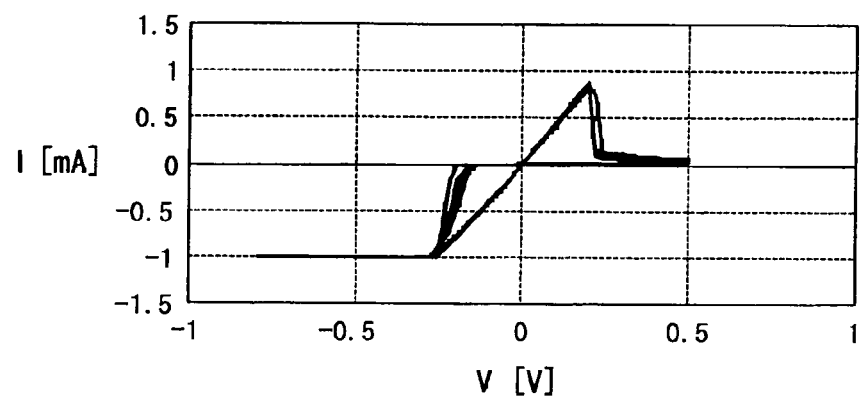
FIG. 12A shows measurement results of I-V characteristic of a memory element of a sample 18.

After the heat treatment in nitrogen atmosphere at 280° C. was performed on each memory element of those samples 18 to 20, I-V characteristic was measured. Measurement results of the I-V characteristic were shown in FIG. 12A to 12C. FIG. 12A shows measurement results of the sample 18, FIG. 12B shows those of the sample 19, and FIG. 12C shows those of the sample 20.

Figure 12B:
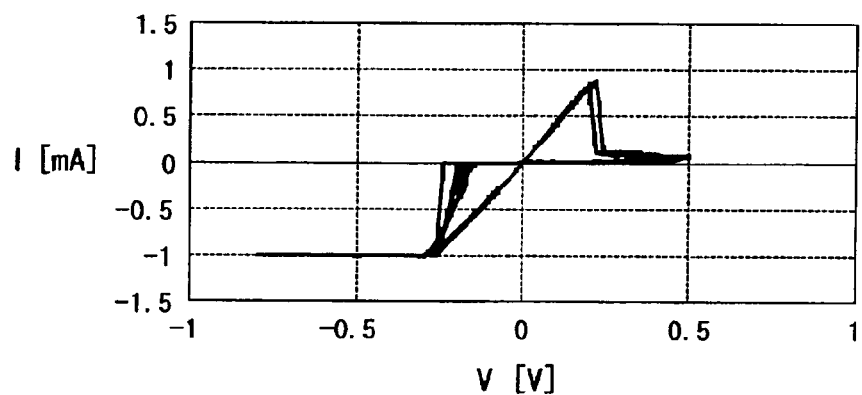
FIG. 12B shows measurement results of I-V characteristic of a memory element of a sample 19.
Figure 12C:
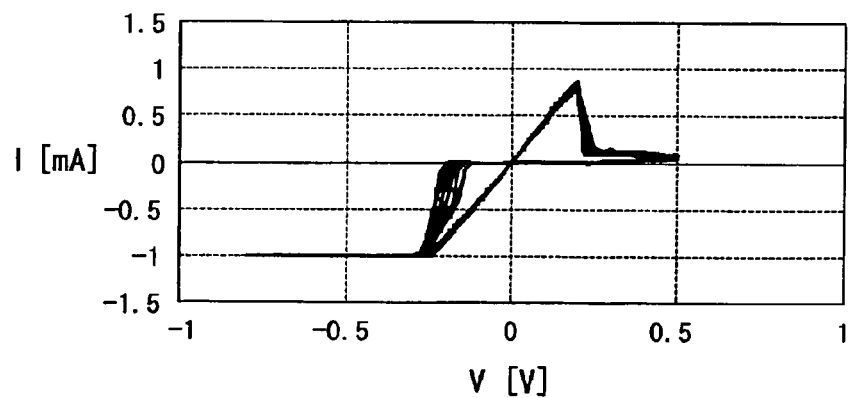
FIG. 12C shows measurement results of I-V characteristic of a memory element of a sample 20.

As shown in FIGS. 12A to 12C, each of the samples 18 to 20, in which boron (B), rare-earth elements and silicon (Si) were contained in the ion source layer, has a favorable I-V characteristic after the heat treatment, similarly to the sample in which boron (B) is contained in the ion source layer and to the sample in which rare-earth elements and silicon (Si) are contained in the ion source layer.

The memory element according to the embodiments of the present invention can be applied to various memory devices. The memory element can be applied to, for example, any form of memories such as: what is called a PROM (Programmable ROM) to which writing can be performed only once, a EEPROM (Electrically Erasable and Programmable ROM) in which erasure can be performed electrically, what is called a RAM (Random Access Memory) where recording, erasure and reproduction can be performed at high speed or the like.

It should be understood by those skilled in the art that various modifications, combinations, sub-combinations and alterations may occur depending on design requirements and other factors insofar as they are within the scope of the appended claims or the equivalents thereof.

What is claimed is:

1. A memory element comprising:
   a memory layer and an ion source layer positioned between first and second electrodes,
   wherein the memory element is adapted to record data using a change in an electrical characteristic of the memory layer,
   wherein the memory layer and the ion source layer are formed separately from each other,
   wherein said ion source layer contains Cu, Ag, and Zn and one or more elements selected from Te, S, Se, and
   wherein said ion source layer further comprises rare-earth elements, silicon and boron to maintain a uniform structure of the ion source layer after the memory element is subjected to a high-temperature heat treatment.

2. The memory element of claim 1, wherein the electrical characteristic is electrical resistance.

3. The memory element of claim 1, wherein the memory film is formed at a time the memory element is manufactured.

4. A memory device comprising:
   a first memory element including a first memory layer and a first ion source layer positioned between first and second electrodes, a first wiring connected to a first side of the first electrode, wherein the first memory layer and the first ion source layer are formed separately from each other,
   a second wiring connected to a second side of the second electrode,
   a second memory element including a second memory layer and a second ion source layer positioned between third and fourth electrodes, wherein the second memory layer and the second ion source layer are formed separately from each other, a third wiring connected to a third side of the third electrode, a fourth wiring connected to a fourth side of the fourth electrode, wherein:

each of the first and second ion source layers comprises Cu, Ag, and Zn and one or more elements selected from Te, S, Se, each of the first and second ion source layers further comprises rare-earth elements, silicon and boron to maintain a uniform structure of each of the first and second ion source layers after the memory device is subjected to a high-temperature heat treatment, the first memory element is adapted to record data using a change in an electrical characteristic of the first memory layer, and the second memory element is adapted to record data using a change in an electrical characteristic of the second memory layer.

5. The memory device of claim 4, wherein the electrical characteristic is electrical resistance.

6. The memory device of claim 4, wherein the first and third wirings are electrically coupled.

7. A memory device comprising:

a first memory element including a first memory layer and a first ion source layer positioned between first and second electrodes, a first wiring connected to a first side of the first electrode, wherein the first memory layer and the first ion source layer are formed separately from each other, a second wiring connected to a second side of the second electrode, a second memory element including a second memory layer and a second ion source layer positioned between third and fourth electrodes, wherein the second memory layer and the second ion source layer are formed separately from each other, a third wiring connected to a third side of the third electrode, a fourth wiring connected to a fourth side of the fourth electrode, wherein:

each of the first and second ion source layers comprises Cu, Ag, and Zn and one or more elements selected from Te, S, Se, each of the first and second ion source layers further comprises boron to maintain a uniform structure of the ion source layer after the memory element is subjected to a high-temperature heat treatment, the first memory element is adapted to record data using a change in an electrical characteristic of the first memory layer, and the second memory element is adapted to record data using a change in an electrical characteristic of the second memory layer.

8. The memory device according to claim 7, wherein the first ion source layer in the first memory element further comprises rare-earth elements or silicon and the second ion source layer in the second memory element further comprises rare-earth elements or silicon.

9. The memory device of claim 7, wherein:

the electrical characteristic is electrical resistance.

10. The memory device of claim 7, wherein the first and third wirings are electrically coupled.

11. A memory element comprising:

a memory layer and an ion source layer positioned between first and second electrodes, wherein the memory element is adapted to record data using a change in an electrical characteristic of the memory layer, wherein the memory layer and the ion source layer are formed separately from each other, wherein said ion source layer comprises Cu, Ag, and Zn and one or more elements selected from Te, S, Se, and wherein said ion source layer further comprises boron to maintain a uniform structure of the ion source layer after the memory element is subjected to a high-temperature heat treatment.

12. The memory element according to claim 11, wherein said ion source layer comprises rare-earth elements or silicon.

13. The memory element of claim 11, wherein the electrical characteristic is electrical resistance.

14. The memory element of claim 11, wherein the memory layer is formed at a time the memory element is manufactured.

15. The memory element of claim 1, wherein the memory layer has a thickness from 0.5 nm to 10 nm.

16. The memory element of claim 11, wherein the memory layer includes at least one oxide of a rare-earth element.

17. The memory element of claim 11, wherein Cu, Ag, and Zn form a current path or an impurity region in the memory layer when the data is recorded.

18. The memory element of claim 11, wherein the memory layer has a high resistance.

19. The memory element of claim 11, wherein the memory element has a thickness of 50 nm or less.

20. The memory element of claim 11, wherein, when the boron is added, a uniform amorphous structure of the ion source layer is maintained after the memory element is subjected to the high-temperature heat treatment.

* * * * *